US011600636B2

(12) United States Patent
Liu et al.

(10) Patent No.: US 11,600,636 B2
(45) Date of Patent: Mar. 7, 2023

(54) STACKED CONNECTIONS IN 3D MEMORY AND METHODS OF MAKING THE SAME

(71) Applicant: Yangtze Memory Technologies Co., Ltd., Hubei (CN)

(72) Inventors: Jun Liu, Hubei (CN); Zongliang Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 66 days.

(21) Appl. No.: 17/112,448

(22) Filed: Dec. 4, 2020

(65) Prior Publication Data
US 2021/0091115 A1    Mar. 25, 2021

Related U.S. Application Data

(63) Continuation of application No. 16/165,703, filed on Oct. 19, 2018, now Pat. No. 10,892,275, which is a
(Continued)

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02178* (2013.01); *H01L 21/02532* (2013.01);
(Continued)

(58) Field of Classification Search
CPC ......... H01L 27/11582; H01L 21/02532; H01L 21/30604; H01L 21/31111; H01L 21/31116
(Continued)

(56) References Cited

U.S. PATENT DOCUMENTS 9,224,752 B1   12/2015   Lee et al.
9,570,463 B1   2/2017    Zhang et al.
(Continued)

FOREIGN PATENT DOCUMENTS

CN    103311264 A    9/2013
CN    105374825 A    3/2016
(Continued)

OTHER PUBLICATIONS

Singapore Application No. 11202103738W, Search Report and Written Opinion completed Mar. 31, 2022; 8 pages.
(Continued)

*Primary Examiner* — Dzung Tran
(74) *Attorney, Agent, or Firm* — Sterne, Kessler, Goldstein & Fox P.L.L.C.

(57) ABSTRACT

Embodiments of three-dimensional memory device architectures and fabrication methods therefore are disclosed. In an example, the memory device includes a substrate having a first layer stack on it. The first layer stack includes alternating conductor and insulator layers. A second layer stack is disposed over the first layer stack where the second layer stack also includes alternating conductor and insulator layers. One or more vertical structures extend through the first layers stack. A conductive material is disposed on a top surface of the one or more vertical structures. One or more second vertical structures extend through the second layer stack and through a portion of the conductive material.

20 Claims, 16 Drawing Sheets

Related U.S. Application Data continuation of application No. PCT/CN2018/100388, filed on Aug. 14, 2018.

(51) Int. Cl.
  *H01L 21/225* (2006.01)
  *H01L 21/306* (2006.01)
  *H01L 21/311* (2006.01)
  *H01L 27/1157* (2017.01)
  *H01L 29/10* (2006.01)
  *H01L 21/28* (2006.01)
  *H01L 21/3105* (2006.01)
  *H01L 21/321* (2006.01)

(52) U.S. Cl.
  CPC .... *H01L 21/02595* (2013.01); *H01L 21/2251* (2013.01); *H01L 21/30604* (2013.01); *H01L 21/31111* (2013.01); *H01L 21/31116* (2013.01); *H01L 27/1157* (2013.01); *H01L 29/1037* (2013.01); *H01L 21/31053* (2013.01); *H01L 21/3212* (2013.01); *H01L 29/40117* (2019.08)

(58) Field of Classification Search
  USPC .......................................................... 257/324
  See application file for complete search history.

(56) References Cited

U.S. PATENT DOCUMENTS

| | | | |
|---|---|---|---|
| 10,038,006 | B2 | 7/2018 | Furihata et al. |
| 10,892,275 | B2 | 1/2021 | Liu et al. |
| 2009/0230449 | A1 | 9/2009 | Sakaguchi et al. |
| 2011/0065270 | A1 | 3/2011 | Shim et al. |
| 2011/0151667 | A1 | 6/2011 | Hwang et al. |
| 2011/0312174 | A1 | 12/2011 | Lee et al. |
| 2012/0003800 | A1 | 1/2012 | Lee et al. |
| 2013/0234090 | A1 | 9/2013 | Lee et al. |
| 2014/0264525 | A1 | 9/2014 | Takahashi et al. |
| 2016/0005760 | A1 | 1/2016 | Dohyun et al. |
| 2016/0079272 | A1* | 3/2016 | Lee ............... H01L 21/223 438/269 |
| 2016/0111432 | A1 | 4/2016 | Rabkin et al. |
| 2016/0204117 | A1 | 7/2016 | Liu et al. |
| 2017/0069636 | A1 | 3/2017 | Park et al. |
| 2017/0103996 | A1 | 4/2017 | Lee et al. |
| 2017/0140941 | A1 | 5/2017 | Zhu et al. |
| 2017/0154892 | A1 | 6/2017 | Oh |
| 2017/0162592 | A1 | 6/2017 | Nishikawa |
| 2018/0182771 | A1 | 6/2018 | Costa et al. |
| 2019/0221558 | A1 | 7/2019 | Chen et al. |
| 2020/0058675 | A1 | 2/2020 | Liu et al. |
| 2021/0118904 | A1 | 4/2021 | Liu et al. |
| 2021/0134835 | A1 | 5/2021 | Liu et al. |
| 2021/0138434 | A1 | 5/2021 | Liu et al. |

FOREIGN PATENT DOCUMENTS

| | | |
|---|---|---|
| CN | 106256005 A | 12/2016 |
| CN | 106531744 A | 3/2017 |
| CN | 107431063 A | 12/2017 |
| CN | 107863351 A | 3/2018 |
| CN | 108093656 A | 5/2018 |
| CN | 108377660 A | 8/2018 |
| KR | 10-1487746 B1 | 2/2015 |
| WO | WO 2015171244 A1 | 11/2015 |
| WO | WO 2016205078 A2 | 12/2016 |

OTHER PUBLICATIONS

International Search Report and Written Opinion of the International Search Authority directed to related PCT Application No. PCT/CN2018/100388, dated May 15, 2019; 9 pages.

Taiwanese Application No. TW109103704, Office Action dated Jun. 4, 2020; 5 pages.

* cited by examiner

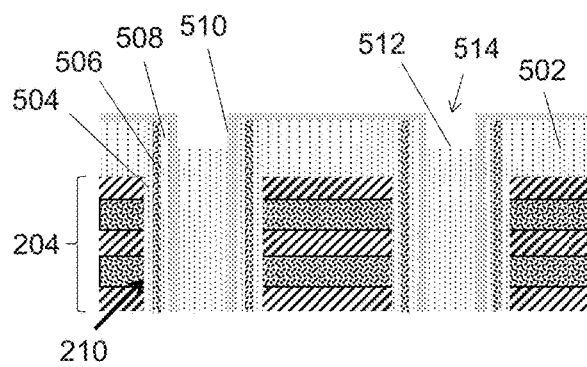 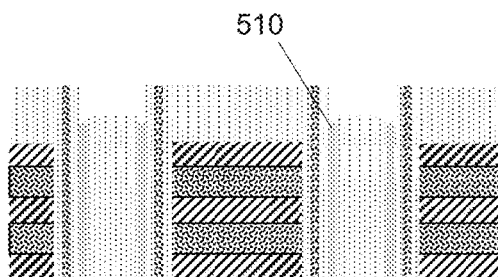
FIG. 5A                    FIG. 5B

STACKED CONNECTIONS IN 3D MEMORY AND METHODS OF MAKING THE SAME

CROSS-REFERENCES TO RELATED APPLICATIONS

This application is a continuation of U.S. patent application Ser. No. 16/165,703, filed on Oct. 19, 2018 and titled "Stacked Connections in 3D Memory And Methods Of Making The Same," which claims priority to International Application No. PCT/CN2018/100388, filed on Aug. 14, 2018, both of which are incorporated herein by reference in their entirety.

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods for forming connections between stacked memory structures provide numerous benefits, including, but not limited to improved alignment tolerance between the stacked memory structures and superior etch-stop capability.

In some embodiments, a first memory device includes a substrate having a first layer stack on it. The first layer stack includes alternating conductor and insulator layers. A second layer stack is disposed over the first layer stack where the second layer stack also includes alternating conductor and insulator layers. One or more vertical structures extend through the first layers stack. A conductive material is disposed on a top surface of the one or more vertical structures. One or more second vertical structures extend through the second layer stack and through a portion of the conductive material.

In some embodiments, a second memory device includes a substrate having a first layer stack on it. The first layer stack includes alternating conductor and insulator layers. A second layer stack is disposed over the first layer stack where the second layer stack also includes alternating conductor and insulator layers. One or more vertical structures extend through the first layer stack. A conductive material is disposed on a top surface of the one or more vertical structures. One or more second vertical structures extend through the second layer stack and abut a top surface of the conductive material.

In some embodiments, a third memory device includes a substrate having a first layer stack on it. The first layer stack includes alternating conductor and insulator layers. One or more vertical structures extend through the first layer stack. A conductive material is disposed on a top surface of the one or more vertical structures. An insulating layer is disposed over the first layer stack and over the conductive material. A second layer stack is disposed over the insulating layer where the second layer stack also includes alternating conductor and insulator layers. One or more second vertical structures extend through the second layer stack and through the insulating layer to abut a top surface of the conductive material.

In some embodiments, the one or more first vertical structures includes one or more first NAND strings and the one or more second vertical structures includes one or more second NAND strings.

In some embodiments, each of the one or more first NAND strings and the one or more second NAND strings includes a plurality of layers surrounding a core insulating material.

In some embodiments, the plurality of layers includes a stack consisting of a first oxide layer, a nitride layer, a second oxide layer, and a polysilicon layer.

In some embodiments, dopants originating from the conductive material are present in portions of the polysilicon layer adjacent to the conductive material.

In some embodiments, the conductive material includes doped polysilicon.

In some embodiments, a portion of the conductive material surrounds a lower end of the one or more second vertical structures.

In some embodiments, the insulating layer comprises aluminum oxide.

In some embodiments, the insulating layer surrounds a lower end of the one or more second vertical structures.

In some embodiments, a method to form the first NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method also includes forming a second layer stack over the first layer stack, the second layer stack including alternating sacrificial and dielectric layers, and forming one or more second openings through the second layer stack and through a portion of the conductive material. The method also includes forming one or more second vertical structures in the one or more second openings.

In some embodiments, a method to form the second NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method includes removing a top portion of the conductive material to form one or more second recesses and forming an insulating material in the one or more second recesses. The method also includes forming a second layer stack over the first layer stack, the second layer stack including alternating sacrificial and dielectric layers, and forming one or more second openings through the second layer stack and through a portion of the insulating material. The method includes removing the insulating material and forming one or more second vertical structures in the one or more second openings.

In some embodiments, a method to form the third NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method includes depositing an insulating layer over the first layer stack and over the conductive material. The method also includes forming a second layer stack over the insulating layer, the second layer stack including alternating sacrificial and dielectric layers, and forming one or more second openings through the second layer stack and through the insulating layer. The method includes removing additional portions of the insulating layer at the bottom of the one or more second openings and forming one or more second vertical structures in the one or more second openings.

In some embodiments, forming the one or more first vertical structures includes depositing a plurality of layers comprising a first oxide layer, a nitride layer, a second oxide layer and a polysilicon layer, depositing a core insulator material.

In some embodiments, removing a top portion of the one or more first vertical structures includes etching back a portion of the core insulator material using a first etching process; etching back a portion of the polysilicon layer using a second etching process; and etching back a portion of the first oxide layer, the nitride layer, and the second oxide layer using one or more other etching processes.

In some embodiments, the method to form any of the first, second, or third memory devices further includes annealing the memory device such that dopants from the conductive material diffuse into the polysilicon layer adjacent to the conductive material.

In some embodiments, depositing the conductive material includes depositing polysilicon.

In some embodiments, the method to form any of the first, second, or third memory devices further includes removing the sacrificial layers of the first layer stack and the second layer stack, and replacing the removed sacrificial layers of the first layer stack and the second layer stack with conductive layers.

In some embodiments, depositing the insulating material includes depositing aluminum oxide.

In some embodiments, depositing the insulating layer includes depositing aluminum oxide.

The three-dimensional memory devices provided by the present disclosure are fabricated using different processes that improve alignment tolerance and etch-stop selectivity when forming the connections between stacked NAND memory strings. The different embodiments involve different materials and processes used when fabricating the connections between upper and lower NAND memory strings.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

FIGS. 5A-5F illustrate side views of a three-dimensional memory structure at different stages of an exemplary fabrication process, according to a first embodiment.

DETAILED DESCRIPTION

Figure 1:
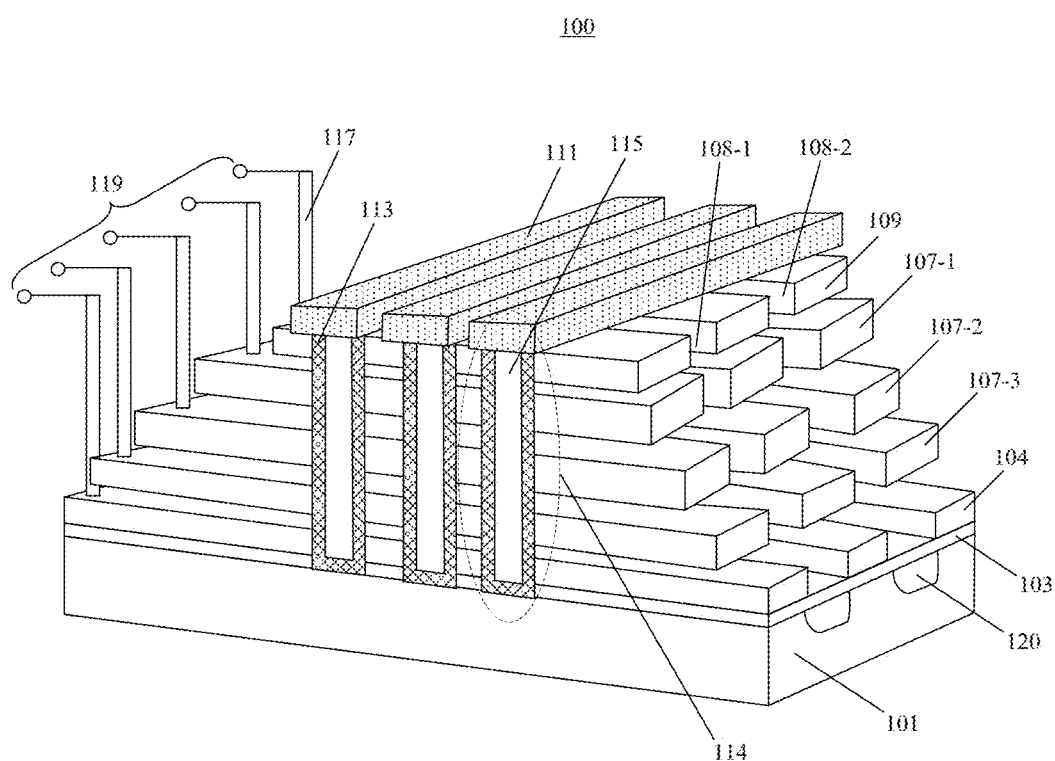
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

Any of the memory devices described herein can be used in an electronic system, such as, for example, portable electronics, computers, or wearable electronics.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity.

Figure 2:
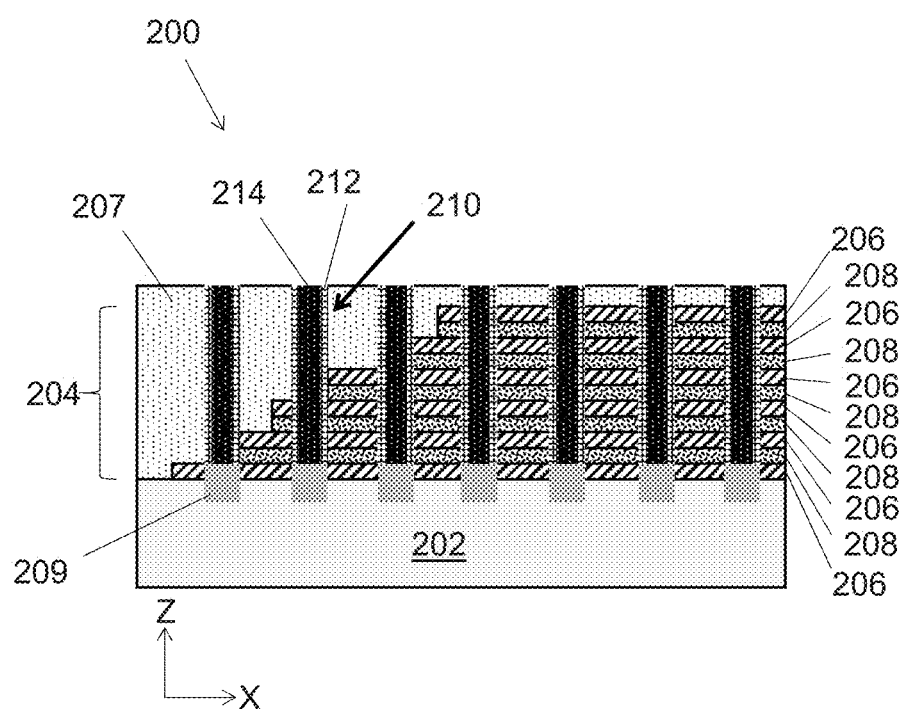
FIG. 2 illustrates a side view of a three-dimensional memory structure at a stage of an exemplary fabrication process, according to some embodiments.
Figure 3:
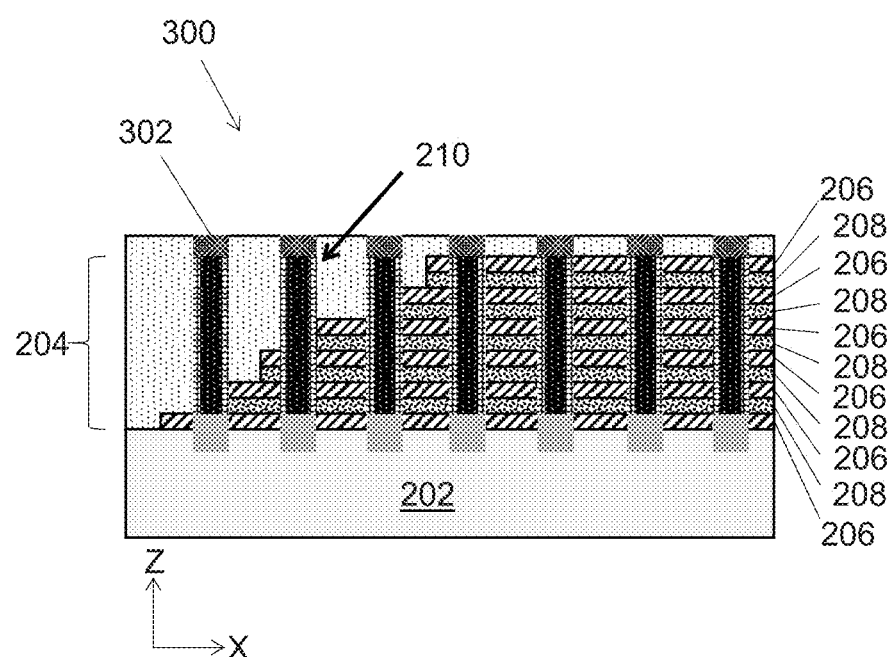
FIG. 3 illustrates a side view of a three-dimensional memory structure at a stage of an exemplary fabrication process, according to some embodiments.
Figure 4:
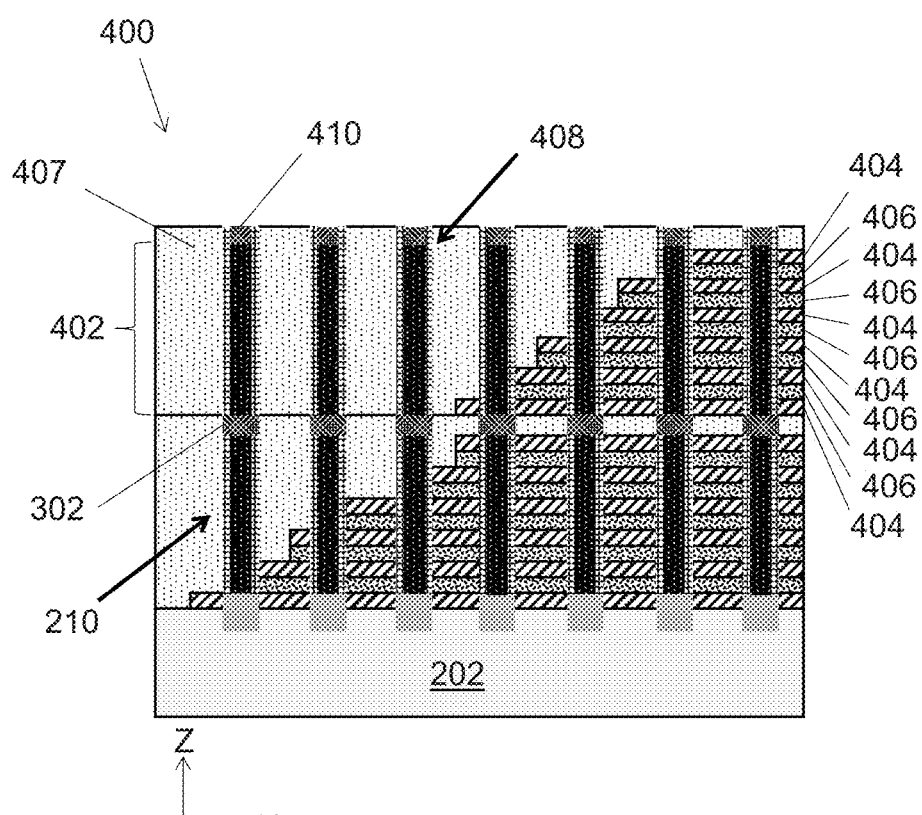
FIG. 4 illustrates a side view of a three-dimensional memory structure at a stage of an exemplary fabrication process, according to some embodiments.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. The structures 200-400 illustrated in FIG. 2 to FIG. 4 are each part of a three-dimensional NAND memory device. FIGS. 5A-5F illustrate an example fabrication process for forming connections between stacked NAND strings, according to a first embodiment. FIGS. 6A-6F illustrate an example fabrication process for forming connections between stacked NAND strings, according to a second embodiment. FIGS. 7A-7F illustrate an example fabrication process for forming connections between stacked NAND strings, according to a third embodiment. Other parts of the memory devices are not shown for ease of description. Although using three-dimensional NAND devices as examples, in various applications and designs, the disclosed structures can also be applied in similar or different semiconductor devices to, e.g., reduce the number of metal connections or wiring. The specific application of the disclosed structures should not be limited by the embodiments of the present disclosure. For illustrative purposes, word lines and gate electrodes are used interchangeably to describe the present disclosure.

FIGS. 2-4 illustrate side views (along the X-axis) of various fabrication stages of an example NAND memory device, according to some embodiments.

FIG. 2 illustrates an exemplary structure 200 for forming a three-dimensional memory structure, according to some embodiments. In some embodiments, structure 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIG. 2, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOI), glass, gallium nitride, gallium arsenide, and/or other suitable III-V compound.

In some embodiments, an alternating sacrificial/dielectric layer stack 204 is formed over substrate 202. The layer stack 204 includes dielectric layers 206 (also referring to as insulator layers) alternating with sacrificial layers 208. The formation of layer stack 204 can involve depositing sacrificial layers 208 to each have the same thickness or to have different thicknesses. Example thicknesses of sacrificial layers 208 can range from 20 nm to 500 nm. Similarly, dielectric layers 206 can each have the same thickness or have different thicknesses. Example thicknesses of dielectric layers 206 can range from 20 nm to 500 nm. Another dielectric material 207 is deposited over layer stack 204. Dielectric material 207 has the same material composition of dielectric layers 206, according to some embodiments.

The dielectric material of sacrificial layers 208 is different from the dielectric material of dielectric layers 206, according to an embodiment. For example, each of sacrificial layers 208 can be silicon nitride while each of dielectric layers 206 can be silicon dioxide. Other example materials for each of sacrificial layers 208 include poly-crystalline silicon, poly-crystalline germanium, and poly-crystalline germanium-silicon. The dielectric materials used for any of dielectric layers 206 or sacrificial layers 208 can include silicon oxide, silicon nitride, silicon oxynitride, or any combination thereof. Although only eleven total layers are illustrated in layer stack 204, it should be understood that this is for illustrative purposes only and that any number of dielectric layers may be included in layer stack 204.

Layer stack 204 includes a portion having a staircase structure where each of at least sacrificial layers 208 terminate at a different length in the horizontal 'X' direction. This staircase structure allows for electrical contact to connect each of the word lines of the memory device.

In some embodiments, a plurality of first vertical structures 210 are formed through layer stack 204 and extending down to an epitaxially grown material 209. Epitaxially grown material 209 can include epitaxially grown silicon, and may extend into a portion of substrate 202. Plurality of first vertical structures 210 can be a plurality of NAND strings that include a plurality of memory layers 212 and a core insulator 214. Plurality of memory layers 212 can include a semiconductor channel layer, such as amorphous silicon, polysilicon, or single crystalline silicon. Plurality of memory layers 212 can also include a tunneling layer, a storage layer (also known as "charge trap/storage layer"), and a blocking layer. The blocking layer, the storage layer, the tunneling layer, and the semiconductor channel layer are arranged over one another on the sidewalls in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 212 includes silicon oxide/silicon nitride/silicon oxide (ONO) dielectrics (e.g., a tunneling layer including silicon oxide, a storage layer including silicon nitride, and a blocking layer including silicon oxide). Core insulator 214 can be any dielectric material, such as oxide, for example. A diameter of first vertical structures 210 can be between about 100 nm and 200 nm.

In some embodiments, the formation of plurality of first vertical structures 210 includes etching a plurality of openings through layer stack 204 and into a portion of substrate 202. Epitaxially grown material 209 is then formed at the bottom of the plurality of openings, followed by deposition of plurality of memory layers 212 and deposition of core insulator 214. A chemical mechanical polishing process (CMP) may also be performed to planarize a top surface of structure 200 following the formation of plurality of first vertical structures 210. Each of the various layers of plurality of memory layers 212 can be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD). Similarly, core insulator 214 can be formed using any of the techniques described above.

FIG. 3 illustrates an exemplary structure 300 for forming the three-dimensional memory device, according to some embodiments. A top portion of first vertical structures 210 is etched to form recesses that are filled with a conductive material 302. In some embodiments, conductive material 302 is provided to form a connection between plurality of first vertical structures 210 and a plurality of second vertical structures formed over plurality of first vertical structures 210 as illustrated in FIG. 4. In some embodiments, conductive material 302 includes polysilicon.

FIG. 4 illustrates an exemplary structure 400 for forming the three-dimensional memory device, according to some embodiments. A second alternating sacrificial/dielectric layer stack 402 is formed over first layer stack 204, according to some embodiments. Layer stack 402 includes dielectric layers 404 alternating with sacrificial layers 406. The formation of layer stack 402 can involve depositing sacrificial layers 406 to each have the same thickness or to have different thicknesses. Example thicknesses of sacrificial layers 406 can range from 10 nm to 60 nm. Similarly, dielectric layers 404 can each have the same thickness or have different thicknesses. Example thicknesses of dielectric layers 404 can range from 10 nm to 60 nm. Another dielectric material 407 is deposited over layer stack 402. Dielectric material 407 has the same material composition of dielectric layers 404, according to some embodiments.

The dielectric material of sacrificial layers 406 is different from the dielectric material of dielectric layers 404, according to an embodiment. For example, each of sacrificial layers 406 can be silicon nitride while each of dielectric layers 404 can be silicon dioxide. Other example materials for each of sacrificial layers 406 include poly-crystalline silicon, poly-crystalline germanium, and poly-crystalline germanium-silicon. The dielectric materials used for any of dielectric layers 404 or sacrificial layers 406 can include silicon oxide, silicon nitride, silicon oxynitride, or any combination thereof. Although only eleven total layers are illustrated in layer stack 402, it should be understood that this is for illustrative purposes only and that any number of dielectric layers may be included in layer stack 402. Dielectric layers 404 can have the same material composition as dielectric layers 206 from layer stack 204. Sacrificial layers 406 can have the same material composition as sacrificial layers 208 from layer stack 204.

Layer stack 402 includes a portion having a staircase structure where each of at least sacrificial layers 406 terminate at a different length in the horizontal 'X' direction. This staircase structure allows for electrical contact to connect each of the word lines of the memory device.

According to some embodiments, a plurality of second vertical structures 408 are formed through layer stack 402 and substantially aligned over plurality of first vertical structures 210. Plurality of second vertical structures 408 can be a plurality of NAND strings that include a plurality of memory layers and a core insulator just as those described for plurality of first vertical structures 210. According to some embodiments, a top portion of plurality of second vertical structures 408 is etched to form recesses that are filled with another conductive material 410, such as for example, polysilicon.

During any of the illustrated fabrication stages of structure 200, 300, or 400, sacrificial layers 208 of layer stack 204 and/or sacrificial layers 406 of second layer stack 402 can be removed and replaced with conductor layers to form alternating insulator/conductor stacks. Sacrificial layers 208/406 can be removed by a suitable etching process, e.g., an isotropic dry etch or a wet etch. The etching process can have sufficiently high etching selectivity of the material of sacrificial layers 208/406 over the materials of other parts of the structure, such that the etching process can have minimal impact on the other parts of the structure. In some embodiments, sacrificial layers 208/406 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100 W and the bias can be lower than about 10 V. In some embodiments, sacrificial layers 208/406 include silicon nitride and the etchant of the wet etch includes phosphoric acid. In some embodiments, dielectric layers 206/404 can be removed such that empty space (vacuum) exists between the conductor layers. The vacuum space between the conductor layers acts as an insulating layer and may help reduce parasitic capacitance.

The conductor layers used to replace sacrificial layers 208/406 can include conductor materials including, but not limited to, W, Co, Cu, Al, doped silicon, silicides, or any combination thereof. Each of the conductor layers can be deposited into the regions left behind by the removal of sacrificial layers sacrificial layers 208/406 using a suitable deposition method such as CVD, sputtering, MOCVD, and/or ALD.

Discussion will now proceed with various fabrication embodiments for forming the connecting regions between plurality of first vertical structures 210 and plurality of second vertical structures 408.

Figure 5C:
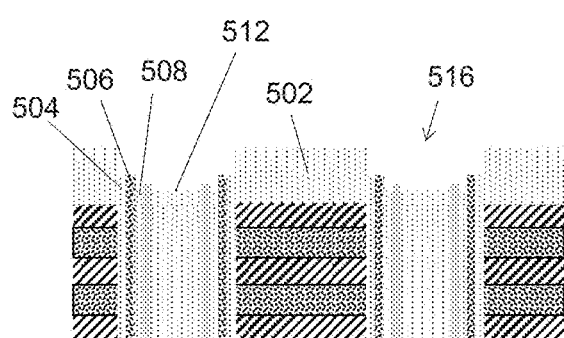

FIGS. 5A-5F illustrate cross sections of a semiconductor structure during a fabrication process, according to a first embodiment. FIG. 5A illustrates first vertical structures 210 extending through layer stack 204 and having a plurality of memory layers including a first oxide layer 504, a nitride layer 506, a second oxide layer 508, and a semiconductor layer 510. In some embodiments, first oxide layer 504 acts as a blocking layer, nitride layer 506 acts as a storage layer, second oxide layer 508 acts as a tunneling layer, and semiconductor layer 510 acts as a channel layer through which current can flow. Semiconductor layer 510 can be polysilicon. In some embodiments, a top dielectric layer 502 is disposed over layer stack 204.

According to some embodiments, a core insulator 512 of first vertical structures 210 is etched back to form recesses 514. Core insulator 512 can include oxide and be etched using various wet etchants known for etching oxide, such as buffered oxide etch (BOE) or hydrofluoric acid.

FIG. 5B illustrates a process of removing exposed portions of semiconductor layer 510 using known wet etchants. In some embodiments, semiconductor layer 510 is etched such that it is recessed below a top surface of core insulator 512.

FIG. 5C illustrates one or more etching processes being performed to etch each of first oxide layer 504, nitride layer 506, and second oxide layer 508, according to some embodiments. The etching process also further etches core insulator 512 and laterally etches into top dielectric layer 502. Different etchants may be required for etching the various memory layers. For example, nitride layer 506 can be etched using phosphoric acid while each of first oxide layer 504 and second oxide layer 508 can be etched using BOE or hydrofluoric acid. A top surface of top dielectric layer 502 can be protected from the etching using a mask layer (not shown). The result of the etching processes yields a wider recess 516 at the top portions of first vertical structures 210.

Figure 5D:
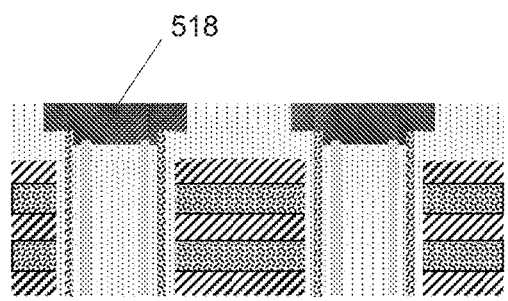

FIG. 5D illustrates the deposition of a conductive material 518 within recesses 516, according to some embodiments. Conductive material 518 can be polysilicon. A CMP procedure can be performed to planarize a top surface of conductive material 518. In some embodiments, dopants are implanted within conductive material 518 using a well-known ion implantation technique. The dopants may be any n-type or p-type dopants to further increase the conductivity of conductive material 518.

Figure 5E:
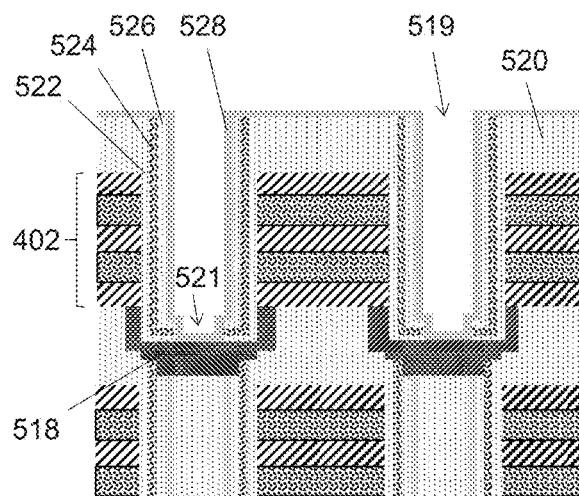

FIG. 5E illustrates the formation of the second layer stack 402 over first layer stack 204. In some embodiments, a top dielectric layer 520 is also formed over layer stack 402. Openings 519 are formed through layer stack 402 and through a portion of conductive material 518. Openings 519 can be formed using deep reactive ion etching (DRIE). In some embodiments, the width of conductive material 518 is wider than openings 519, which provides improved alignment tolerance when forming openings 519.

Memory layers of second vertical structures 408 are deposited within openings 519. For example, a first oxide layer 522, a nitride layer 524, a second oxide layer 526, and a semiconductor layer 528 are deposited, in the order listed, within openings 519. In order to ensure that semiconductor layer 528 makes an ohmic contact with conductive material 518, another etch can be performed through each of the memory layers at the bottom of openings 519 to form nested recess 521, and semiconductor layer 528 is stripped away and re-deposited within nested recess 521, according to some embodiments.

Figure 5F:
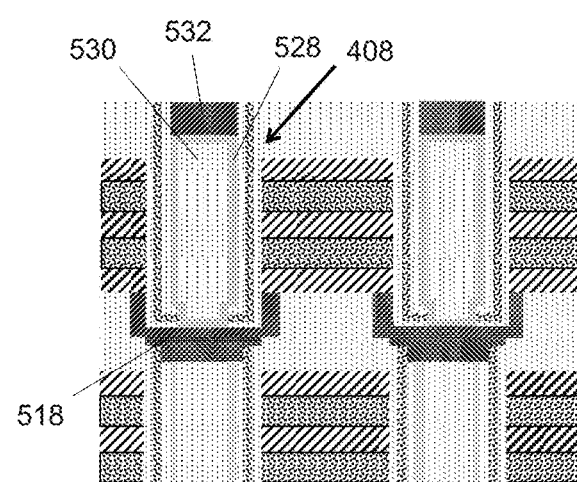

FIG. 5F illustrates the completion of the formation of second vertical structures 408, according to some embodiments. Specifically, a core insulator 530 is deposited to fill a remainder of openings 519, and subsequently recessed to provide space for depositing a top conductive material 532. Top conductive material 532 can include polysilicon. In some embodiments, top conductive material 532 is the same material as semiconductor layer 528. The top conductive material 532 can provide electrical connection to the semiconductor layer 528. According to some embodiments, a bottom portion of second vertical structures 408 is surrounded by conductive material 518. Top conductive material 532 can be similarly doped as described above with respect to conductive material 518. In some embodiments, the dopants that are either diffused or implanted into top conductive material 532 do not extend through the entire thickness of top conductive material 532. According to some embodiments, a width of conductive material 518 is greater than widths of each of first vertical structures 210 and second vertical structures 408, such that conductive material 518 projects outward from each of first vertical structures 210 and second vertical structures 408.

According to some embodiments, dopants from top conductive material 532 and conductive material 518 can diffuse into adjacent portions of semiconductor layer 528 of second vertical structures 408 and semiconductor layer 510 of first vertical structures 210. The diffusion may be aided by annealing the semiconductor structure at a high temperature between 750 and 950° C., for about 30 minutes.

Figures 6A, 6B:
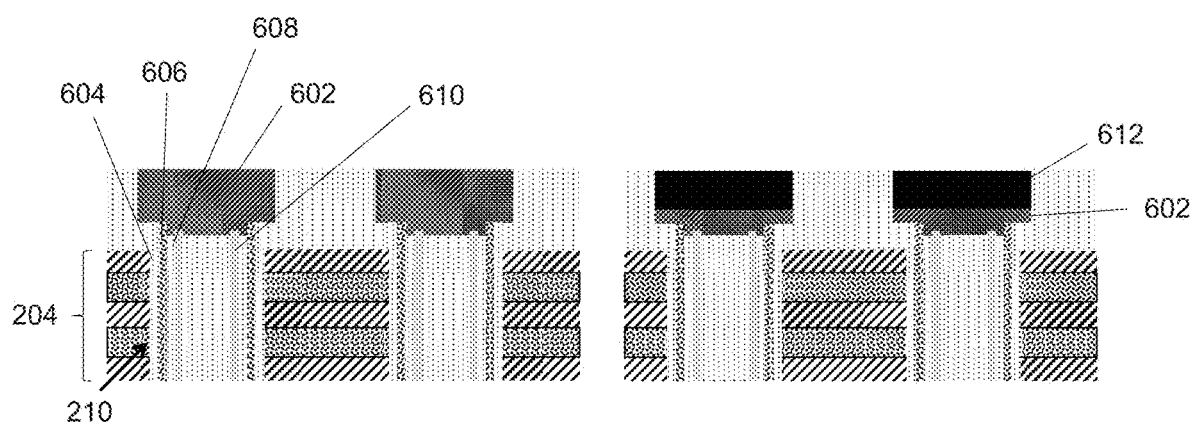
FIGS. 6A-6F illustrate side views of a three-dimensional memory structure at different stages of an exemplary fabrication process, according to a second embodiment.

FIGS. 6A-6F illustrate cross sections of a semiconductor structure during a fabrication process, according to a second embodiment. FIG. 6A illustrates first vertical structures 210 extending through layer stack 204 and having a plurality of memory layers including a first oxide layer 604, a nitride layer 606, a second oxide layer 608, and a semiconductor layer 610. FIG. 6A illustrates a fabrication stage similar to that illustrated in FIG. 5D, and thus each of the operations discussed from FIG. 5A-5D are similarly performed to form a conductive material 602 filling recesses at the top portions of first vertical structures 210. Conductive material 602 can be polysilicon, and may have properties similar to that of conductive material 518 described in FIGS. 5D-5F.

FIG. 6B illustrates the removal of a top portion of conductive material 602 to form recesses that are subsequently filled with insulating material 612, according to some embodiments. Insulating material 612 can be deposited using any known chemical or physical vapor deposition technique. In one example, insulating material 612 is aluminum oxide. After deposition, a top surface of insulating material 612 can be planarized using CMP.

Figures 6C, 6D:
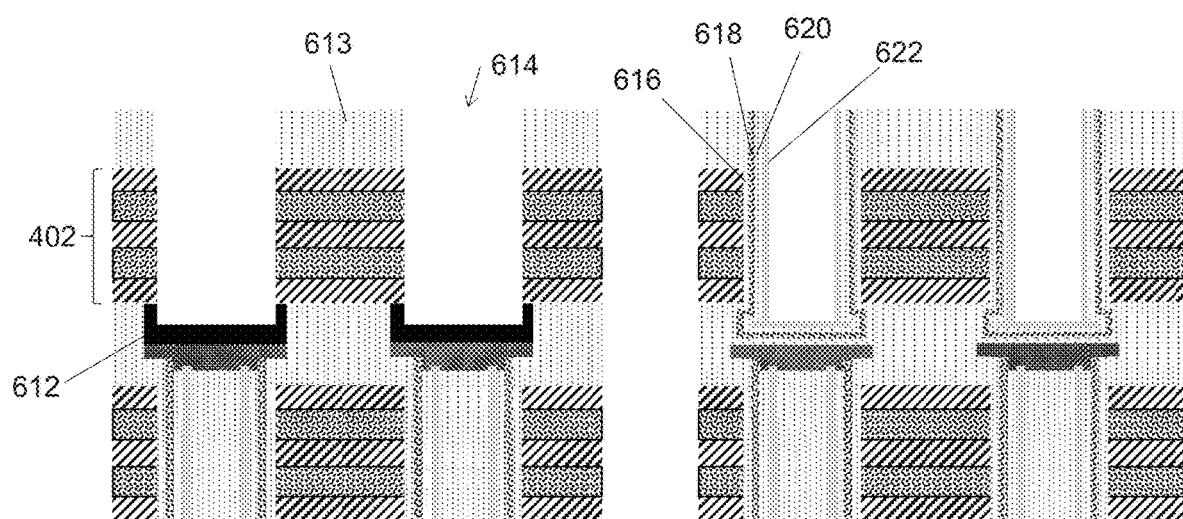

FIG. 6C illustrates the formation of second layer stack 402 over first layer stack 204. In some embodiments, a top dielectric layer 613 is formed over layer stack 402. Openings 614 are formed through layer stack 402 and through a portion of insulating material 612. Openings 614 can be formed using DRIE. In this arrangement, insulating material 612 can act as an etch-stop material for the etching of openings 614, and can protect the underlying conductive material 602 from being etched by the formation of openings 614. In some embodiments, the width of both conductive material 602 and insulating material 612 are wider than openings 614, which provides improved alignment tolerance when forming openings 614.

FIG. 6D illustrates the formation of memory layers of second vertical structures 408 within openings 614 after the removal of insulating material 612, according to some embodiments. For example, a first oxide layer 616, a nitride layer 618, a second oxide layer 620, and a semiconductor layer 622 are deposited, in the order listed, within openings 614. One or more of the memory layers also form along sidewalls of a groove at the bottom of openings 614 that is left behind after the removal of insulating material 612.

Figure 6E:
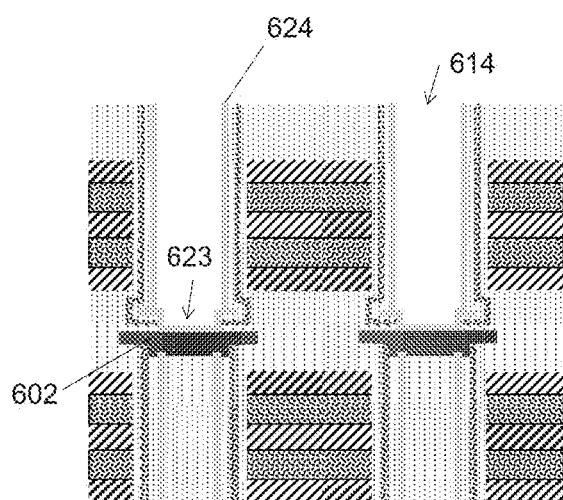

FIG. 6E illustrates an additional etching process to punch through the memory layers at the bottom of openings 614 to form nested recess 623, according to some embodiments. Semiconductor layer 622 is stripped away and re-deposited within nested recess 623 as semiconductor layer 624, according to some embodiments. Semiconductor layer 624 makes ohmic contact with conductive material 602, and can be the same material as semiconductor layer 622.

Figure 6F:
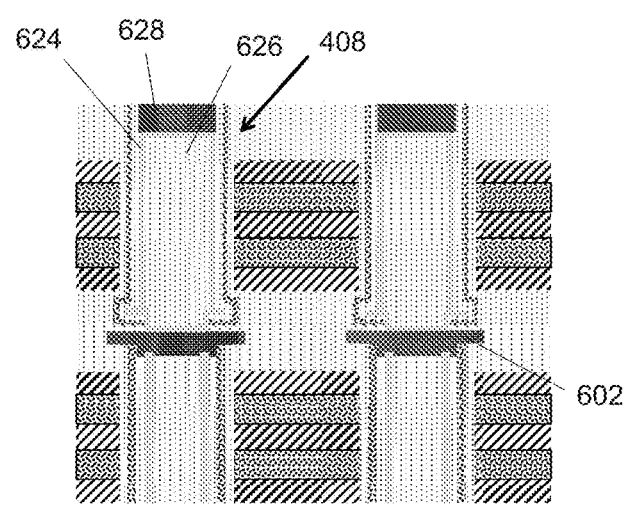

FIG. 6F illustrates the completion of the formation of second vertical structures 408, according to some embodiments. Specifically, a core insulator 626 is deposited to fill a remainder of openings 614, and subsequently recessed to provide space for depositing a top conductive material 628. Top conductive material 628 can include polysilicon. In some embodiments, top conductive material 628 is the same material as semiconductor layer 624. According to some embodiments, second vertical structures 408 are formed directly on a top surface of conductive material 602. Top conductive material 628 can be similarly doped as described above with respect to conductive material 602. In some embodiments, the dopants that are either diffused or implanted into top conductive material 628 do not extend through the entire thickness of top conductive material 628. According to some embodiments, a width of conductive material 602 is greater than widths of each of first vertical structures 210 and second vertical structures 408, such that conductive material 602 projects outward from each of first vertical structures 210 and second vertical structures 408.

According to some embodiments, dopants from top conductive material 628 and conductive material 602 can diffuse into adjacent portions of semiconductor layer 624 of second vertical structures 408 and semiconductor layer 610 of first vertical structures 210. The diffusion may be aided by annealing the semiconductor structure at a high temperature between 750 and 950° C., for about 30 minutes.

Figure 7A:
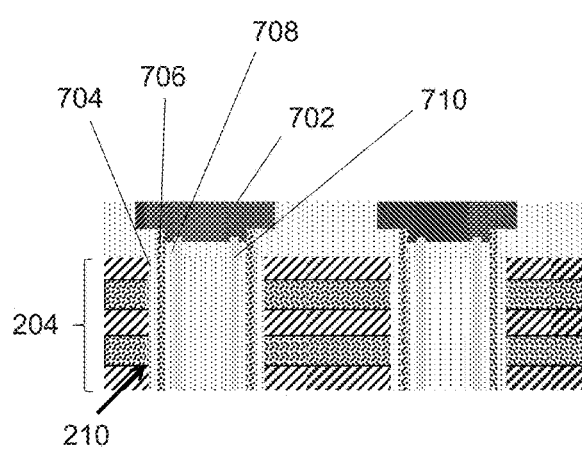
FIGS. 7A-7F illustrate side views of a three-dimensional memory structure at different stages of an exemplary fabrication process, according to a third embodiment.

FIGS. 7A-7F illustrate cross sections of a semiconductor structure during a fabrication process, according to a third embodiment. FIG. 7A illustrates first vertical structures 210 extending through layer stack 204 and having a plurality of memory layers including a first oxide layer 704, a nitride layer 706, a second oxide layer 708, and a semiconductor layer 710. FIG. 7A illustrates a fabrication stage similar to that illustrated in FIG. 5D, and thus each of the operations discussed from FIG. 5A-5D are similarly performed to form a conductive material 702 filling recesses at the top portions of first vertical structures 210. Conductive material 702 can be polysilicon, and may have properties similar to that of conductive material 518 described in FIGS. 5D-5F.

Figure 7B:
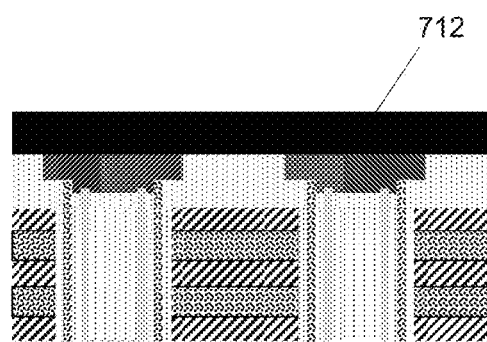

FIG. 7B illustrates the deposition of an insulating layer 712 over layer stack 204 and on a top surface of conductive material 702. Insulating layer 712 can be deposited using any known chemical or physical vapor deposition technique. In one example, insulating layer 712 is aluminum oxide. After deposition, a top surface of insulating layer 712 can be planarized using CMP.

Figures 7C, 7D:
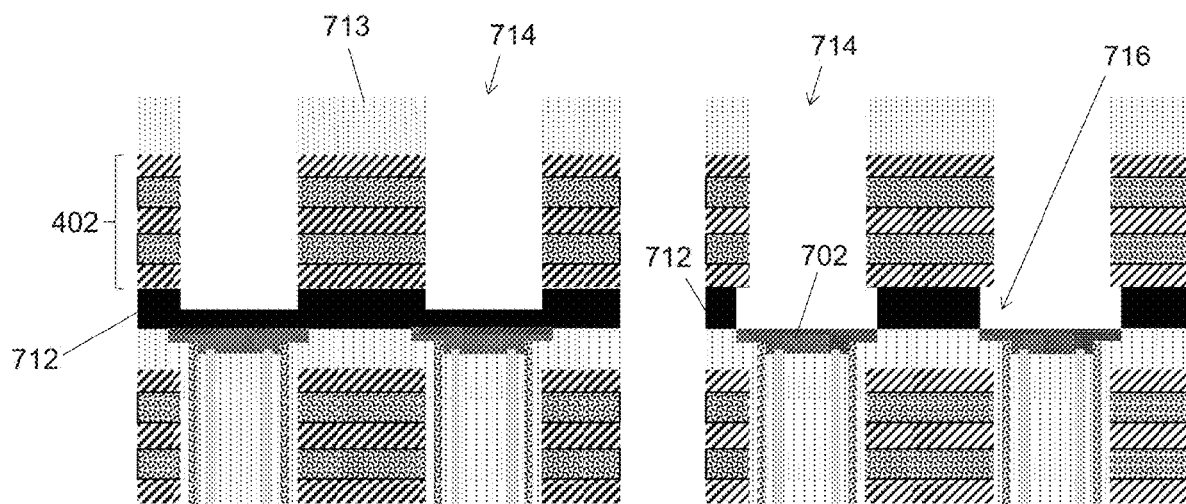

FIG. 7C illustrates the formation of second layer stack 402 over first layer stack 204. In some embodiments, a top dielectric layer 713 is formed over layer stack 402. Openings 714 are formed through layer stack 402 and through a portion of insulating layer 712. Openings 714 can be formed using DRIE. In this arrangement, insulating layer 712 can act as an etch-stop material for the etching of openings 714, and can protect the underlying conductive material 702 from being etched by the formation of openings 714. In some embodiments, the width of conductive material 702 is wider than openings 714, which provides improved alignment tolerance when forming openings 714.

FIG. 7D illustrates the removal of a portion of insulating layer 712 from the bottom of openings 714, according to some embodiments. Portions of insulating layer 712 can be removed using standard wet etchants such that lateral portions of insulating layer 712 are etched beneath layer stack 402. Insulating layer 712 can be etched until a significant portion of a top surface of conductive material 702 is exposed. Removing the portions of insulating layer 712 creates a groove 716 at the lower end of openings 714, according to some embodiments. Other portions of insulating layer 712 remain between adjacent openings 714, according to some embodiments.

Figure 7E:
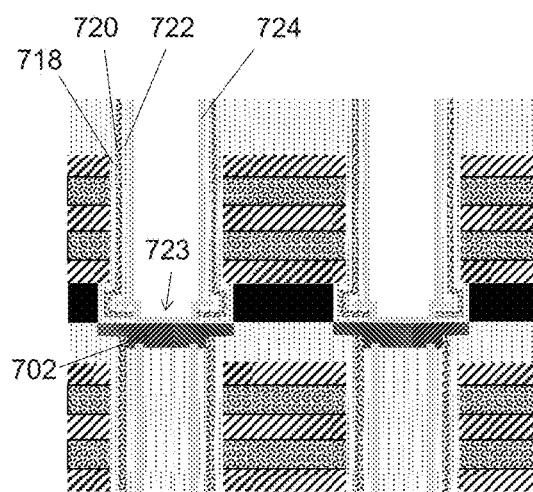

FIG. 7E illustrates the formation of memory layers of second vertical structures 408 within openings 714 after the removal of the portions of insulating layer 712, according to some embodiments. For example, a first oxide layer 718, a nitride layer 720, a second oxide layer 722, and a semiconductor layer 724 are deposited, in the order listed, within openings 714. Each of the memory layers also form along sidewalls of groove 716 at the bottom of openings 714 that is left behind after the removal of the portions of insulating layer 712.

An additional etching process can be performed to punch through the memory layers at the bottom of openings 714 to form nested recess 723, according to some embodiments. Semiconductor layer 724 is stripped away and re-deposited within nested recess 723, according to some embodiments. Semiconductor layer 724 makes ohmic contact with conductive material 702.

Figure 7F:
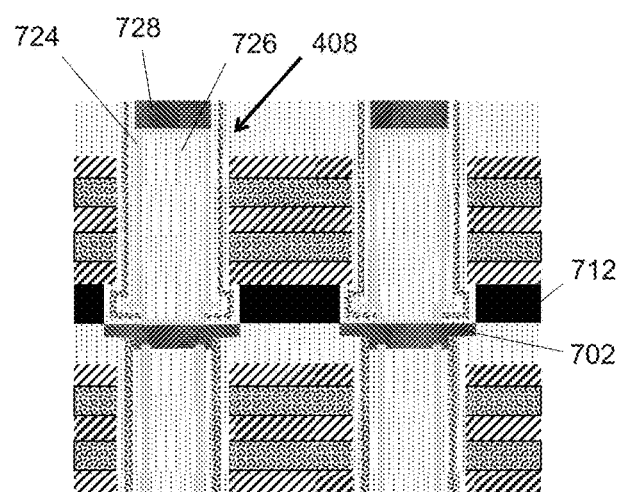

FIG. 7F illustrates the completion of the formation of second vertical structures 408, according to some embodiments. Specifically, a core insulator 726 is deposited to fill a remainder of openings 714, and subsequently recessed to provide space for depositing a top conductive material 728. Top conductive material 728 can include polysilicon. In some embodiments, top conductive material 728 is the same material as semiconductor layer 724. According to some embodiments, second vertical structures 408 are formed directly on a top surface of conductive material 702. Top conductive material 728 can be similarly doped as described above with respect to conductive material 702. In some embodiments, the dopants that are either diffused or implanted into top conductive material 728 do not extend through the entire thickness of top conductive material 728. According to some embodiments, a width of conductive material 702 is greater than widths of each of first vertical structures 210 and second vertical structures 408, such that conductive material 702 projects outward from each of first vertical structures 210 and second vertical structures 408.

According to some embodiments, dopants from top conductive material 728 and conductive material 702 can diffuse into adjacent portions of semiconductor layer 724 of second vertical structures 408 and semiconductor layer 710 of first vertical structures 210. The diffusion may be aided by annealing the semiconductor structure at a high temperature between 750 and 950° C., for about 30 minutes.

Figure 8:
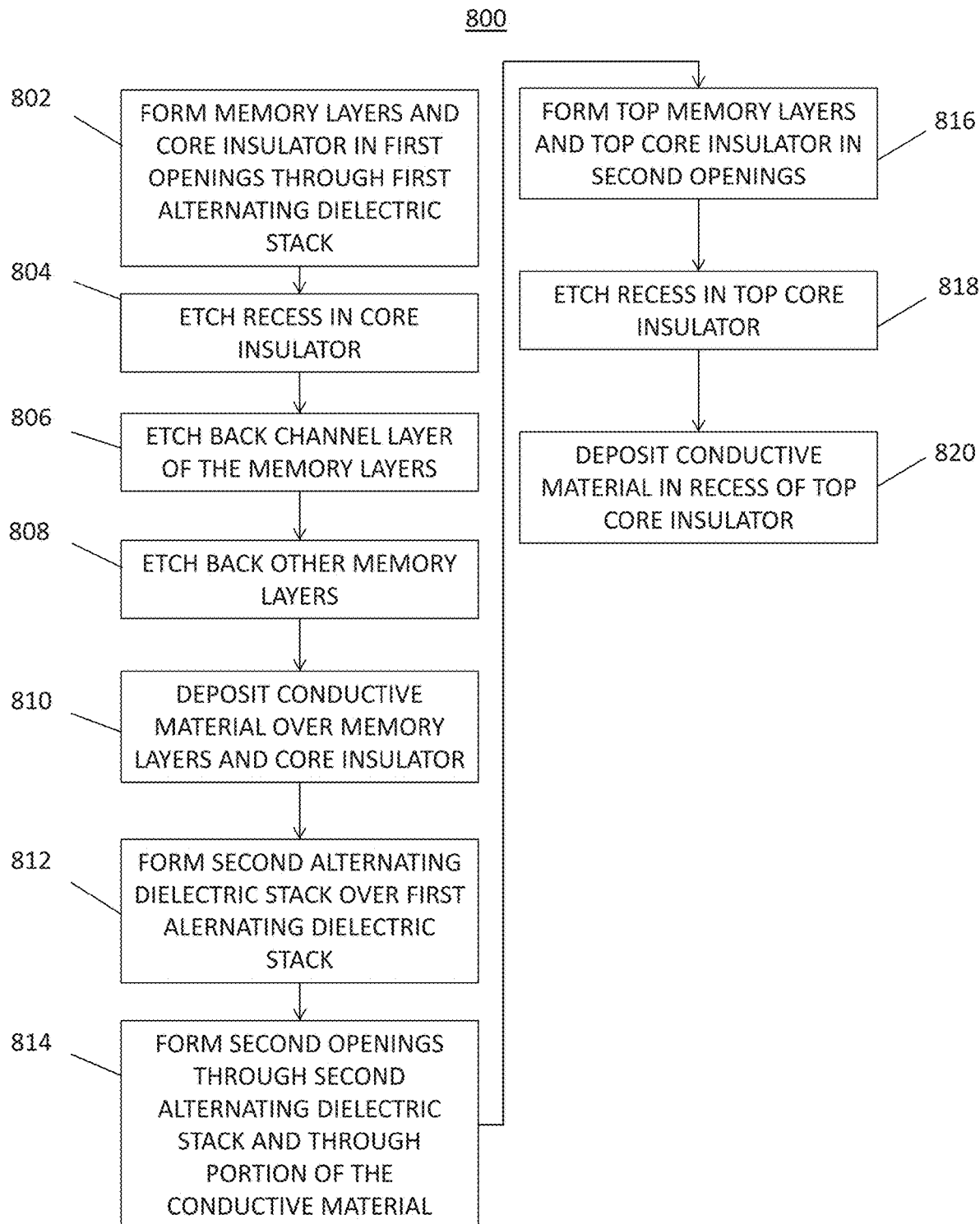
FIG. 8 is an illustration of a fabrication process for forming a three-dimensional memory structure, according to a first embodiment.

FIG. 8 is a flowchart of an exemplary method 800 for forming a NAND memory device, according to the first embodiment. The operations of method 800 are generally illustrated in FIGS. 5A-5F. It should be understood that the operations shown in method 800 are not exhaustive and that other operations can be performed as well before, after, or between any of the illustrated operations. In various embodiments of the present disclosure, the operations of method 800 can be performed in a different order and/or vary.

In operation 802, first NAND strings comprising a plurality of memory layers and core insulators are formed in first openings through a first alternating dielectric stack disposed over a substrate. The first alternating dielectric stack may include sacrificial dielectric layers alternating with dielectric layers having a different material composition. The layers of the first alternating dielectric stack can include materials including, but not limited to, silicon oxide, silicon nitride, silicon oxynitride, or any combination thereof. The layers of the first alternating dielectric stack can include dielectric materials deposited by one or more thin film deposition processes including, but not limited to, CVD, PVD, ALD, or any combination thereof.

According to some embodiments, the layers of the first alternating dielectric stack have a staircase structure where each of at least the sacrificial layers terminate at a different length in a horizontal direction over the surface of the substrate. This staircase structure allows for electrical contact to connect each of the word lines of the memory device.

Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide).

In operation 804, recesses are etched into a top portion of the core insulator within the first openings. The recesses may be etched using BOE or hydrofluoric acid when core insulator is oxide.

In operation 806, the semiconductor channel layer is etched back. Wet etchants may be used to etch the semiconductor channel, and the semiconductor channel can be etched until it is recessed below a top surface of the core insulator.

In operation 808, other ones of the memory layers are etched back using one or more wet etching processes. For example, each of the tunneling layer, storage layer, and blocking layer may be etched in the listed order using different etch processes for each layer.

In operation 810, a conductive material is deposited over the etched memory layers and the etched core insulator of the first NAND memory strings. The conductive material can be deposited into recesses formed from the etching performed in operations 804-808. The conductive material can be polysilicon and can be doped using n-type or p-type dopants to further increase its conductivity.

In operation 812, a second alternating dielectric stack is formed over the first alternating dielectric stack. The second alternating dielectric stack may include sacrificial dielectric layers alternating with dielectric layers having a different material composition. The layers of the second alternating dielectric stack can include materials including, but not limited to, silicon oxide, silicon nitride, silicon oxynitride, or any combination thereof. The layers of the second alternating dielectric stack can include dielectric materials deposited by one or more thin film deposition processes including, but not limited to, CVD, PVD, ALD, or any combination thereof.

According to some embodiments, the layers of the second alternating dielectric stack have a staircase structure where each of at least the sacrificial layers terminate at a different length in a horizontal direction over the surface of the substrate. This staircase structure allows for electrical contact to connect each of the word lines of the memory device.

In operation 814, second openings are etched through the second alternating dielectric stack and through a portion of the conductive material. The second openings may be substantially aligned with the first NAND strings formed in the first openings. The second openings can be formed to have substantially the same diameter or cross-sectional shape as the first NAND strings. The second openings can be formed using DRIE.

In operation 816, top memory layers and top core insulators are deposited within the second openings to form second NAND strings. The second NAND strings may be formed using substantially the same processes and materials used to form the first NAND strings. According to some embodiments, a lower portion of the second NAND strings is surrounded by the conductive material deposited in operation 810.

In operation 818, a top portion of the top core insulators of the second NAND strings is recessed using any suitable etching process, such as BOE or hydrofluoric acid when top core insulator is oxide.

In operation 820, a conductive material is deposited within the recesses of the top core insulators. The conductive material in the recesses of the top core insulator may include polysilicon. The conductive material in the recesses of the top core insulator may be similarly doped as described above with respect to the conductive material deposited in operation 810.

According to some embodiments, after formation of the conductive material in operation 820, an annealing process is performed to allow dopants from the conductive material deposited in operations 810 and 820 to diffusive into the adjacent semiconductor channels of the first NAND strings and the second NAND strings.

According to some embodiments, the sacrificial layers of the first and second alternating dielectric stacks may be removed and replaced by conductor layers to form first and second alternating conductor/insulator stacks at any time during method 800.

Figure 9:
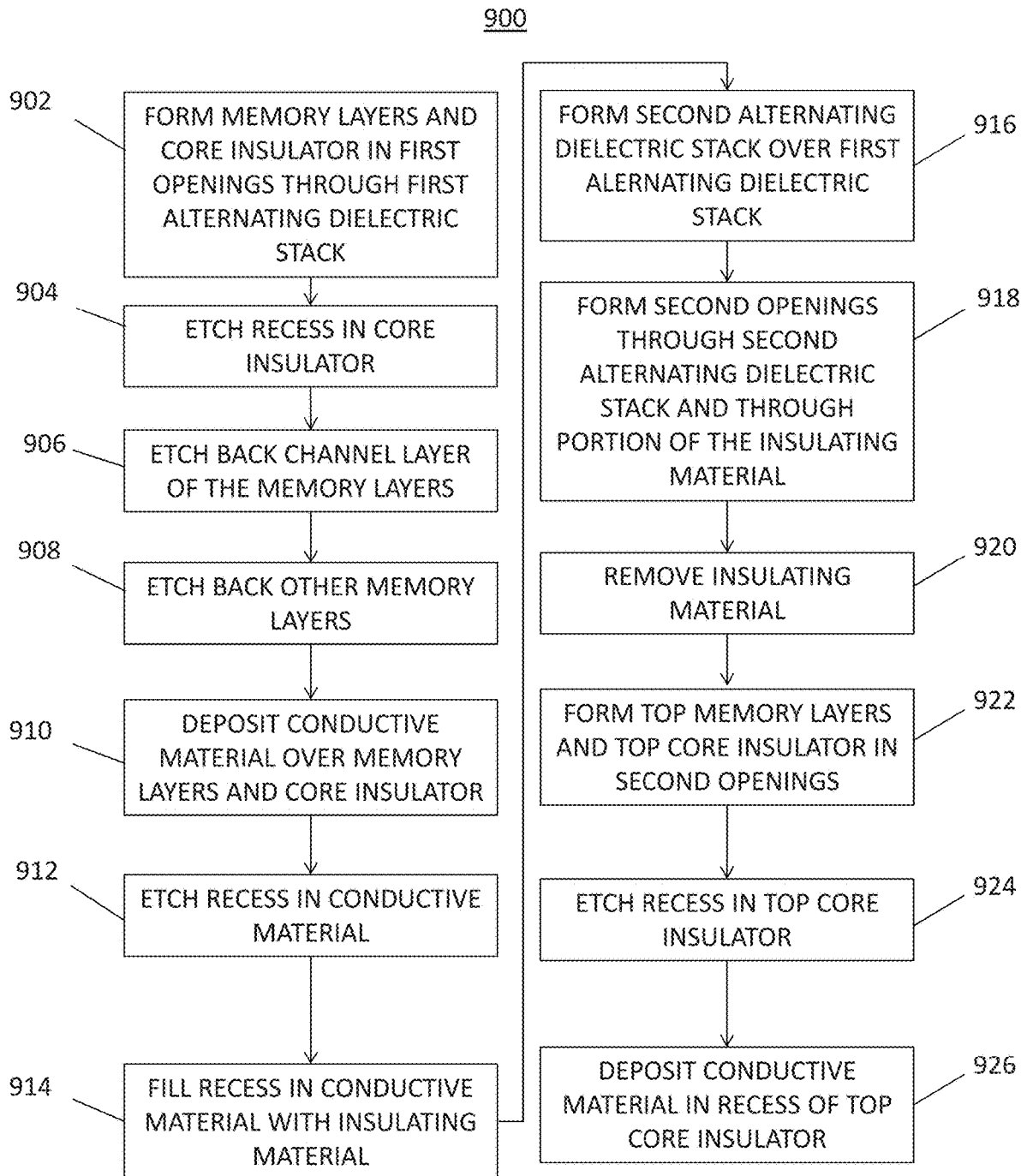
FIG. 9 is an illustration of a fabrication process for forming a three-dimensional memory structure, according to a second embodiment.

FIG. 9 is a flowchart of an exemplary method 900 for forming a NAND memory device, according to the second embodiment. The operations of method 900 are generally illustrated in FIGS. 6A-6F. It should be understood that the operations shown in method 900 are not exhaustive and that other operations can be performed as well before, after, or between any of the illustrated operations. In various embodiments of the present disclosure, the operations of method 900 can be performed in a different order and/or vary.

Operations 902-910 are the same as operations 802-810 described above in method 800, and thus their description is not repeated here.

In operation 912, a recess is etched in a top surface of the conductive material deposited in operation 910. The recess may be etched using any standard wet or dry processes.

In operation 914, the etched recess from operation 912 is filled with an insulating material. The insulating material can be deposited using any known chemical or physical vapor deposition technique. In one example, the insulating material is aluminum oxide. After deposition, a top surface of the insulating material may be planarized using CMP.

In operation 916, a second alternating dielectric stack is deposited over the first alternating dielectric stack just as described in operation 812 of method 800.

In operation 918, second openings are etched through the second alternating dielectric stack and through a portion of the insulating material. The second openings may be substantially aligned with the first NAND strings formed in the first openings. The second openings can be formed to have substantially the same diameter or cross-sectional shape as the first NAND strings. The second openings can be formed using DRIE.

In operation 920, the insulating material is removed from the bottom of the second openings, leaving behind a groove at the bottom of the second openings. The insulating material can be removed using standard wet etching procedures.

In operation 922, top memory layers and top core insulators are deposited within the second openings to form second NAND strings. The second NAND strings may be formed using substantially the same processes and materials used to form the first NAND strings. According to some embodiments, one or more of the memory layers also form along sidewalls of the groove at the bottom of the second openings that is left behind after the removal of the insulating material in operation 920. Formation of the top memory layers can involve etching through the top memory layers deposited at the bottom of the second openings and re-depositing the semiconductor channel layer to ensure that it makes ohmic contact with the conductive material.

In operation 924, a top portion of the top core insulators of the second NAND strings is recessed using any suitable etching process, such as BOE or hydrofluoric acid when top core insulator is oxide.

In operation 926, a conductive material is deposited within the recesses of the top core insulators. The conductive material in the recesses of the top core insulator may include polysilicon. The conductive material in the recesses of the top core insulator may doped similarly to the conductive material deposited in operation 910.

According to some embodiments, after formation of the conductive material in operation 926, an annealing process is performed to allow dopants from the conductive material deposited in operations 910 and 926 to diffusive into the adjacent semiconductor channels of the first NAND strings and the second NAND strings.

According to some embodiments, the sacrificial layers of the first and second alternating dielectric stacks may be removed and replaced by conductor layers to form first and second alternating conductor/insulator stacks at any time during method 900.

Figure 10:
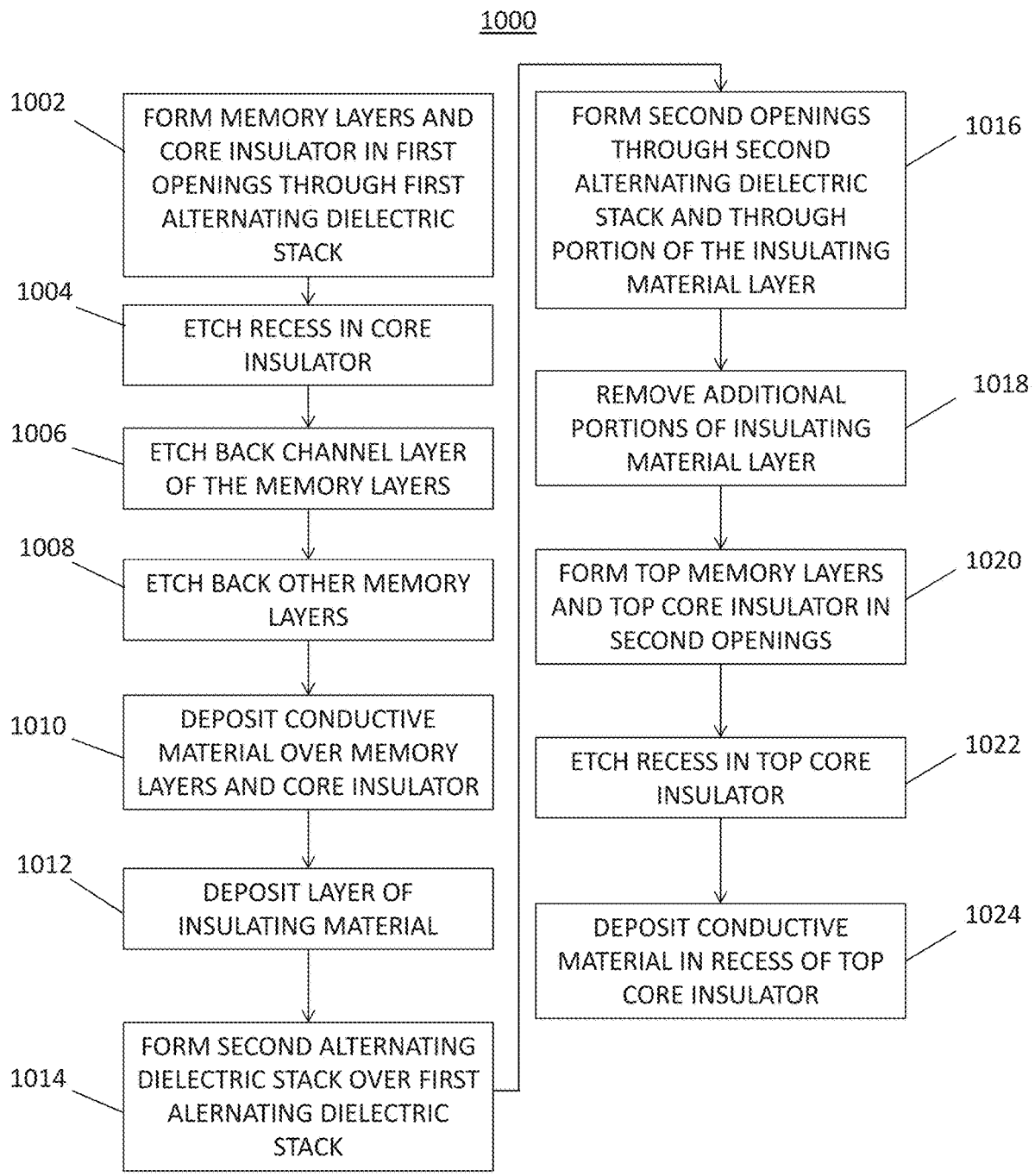
FIG. 10 is an illustration of a fabrication process for forming a three-dimensional memory structure, according to a third embodiment.

FIG. 10 is a flowchart of an exemplary method 1000 for forming a NAND memory device, according to the third embodiment. The operations of method 1000 are generally illustrated in FIGS. 7A-7F. It should be understood that the operations shown in method 1000 are not exhaustive and that other operations can be performed as well before, after, or between any of the illustrated operations. In various embodiments of the present disclosure, the operations of method 1000 can be performed in a different order and/or vary.

Operations 1002-1010 are the same as operations 802-810 described above in method 800, and thus their description is not repeated here.

In operation 1012, an insulating layer is deposited over the first alternating dielectric stack and on the top surface of the conductive material deposited in operation 1010. The insulating layer can be deposited using any known chemical or physical vapor deposition technique. In one example, the insulating layer is aluminum oxide.

In operation 1014, a second alternating dielectric stack is deposited over the first alternating dielectric stack just as described in operation 812 of method 800.

In operation 1016, second openings are etched through the second alternating dielectric stack and through a portion of the insulating layer. The second openings may be substantially aligned with the first NAND strings formed in the first openings. The second openings can be formed to have substantially the same diameter or cross-sectional shape as the first NAND strings. The second openings can be formed using DRIE.

In operation 1018, additional portions of the insulating layer are removed from the bottom of the second openings, leaving behind a groove at the bottom of the second openings. The portions of the insulating layer can be removed using standard wet etching procedures. The insulating layer can be etched until a significant portion of a top surface of the conductive material is exposed, according to some embodiments. Other portions of the insulating layer remain between adjacent ones of the second openings, according to some embodiments.

In operation 1020, top memory layers and top core insulators are deposited within the second openings to form second NAND strings. The second NAND strings may be formed using substantially the same processes and materials used to form the first NAND strings. According to some embodiments, one or more of the memory layers also form along sidewalls of the groove at the bottom of the second openings that is left behind after the removal of the portions of the insulating layer in operation 1018. Formation of the top memory layers can involve etching through the top memory layers deposited at the bottom of the second openings and re-depositing the semiconductor channel layer to ensure that it makes ohmic contact with the conductive material.

In operation 1022, a top portion of the top core insulators of the second NAND strings is recessed using any suitable etching process, such as BOE or hydrofluoric acid when top core insulator is oxide.

In operation 1024, a conductive material is deposited within the recesses of the top core insulators. The conductive material in the recesses of the top core insulator may include polysilicon. The conductive material in the recesses of the top core insulator may doped similarly to the conductive material deposited in operation 1010.

According to some embodiments, after formation of the conductive material in operation 1024, an annealing process is performed to allow dopants from the conductive material deposited in operations 1010 and 1024 to diffusive into the adjacent semiconductor channels of the first NAND strings and the second NAND strings.

According to some embodiments, the sacrificial layers of the first and second alternating dielectric stacks may be removed and replaced by conductor layers to form first and second alternating conductor/insulator stacks at any time during method 1000.

The present disclosure describes various embodiments of three-dimensional NAND memory device and methods of making the same. In some embodiments, a first NAND memory device includes a substrate having a first layer stack on it. The first layer stack includes alternating conductor and insulator layers. A second layer stack is disposed over the first layer stack where the second layer stack also includes alternating conductor and insulator layers. One or more vertical structures extend through the first layers stack. A conductive material is disposed on a top surface of the one or more vertical structures. One or more second vertical structures extend through the second layer stack and through a portion of the conductive material.

In some embodiments, a method to form the first NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method also includes forming a second layer stack over the first layer stack, the second layer stack including alternating sacrificial and dielectric layers, and forming one or more second openings through the second layer stack and through a portion of the conductive material. The method also includes forming one or more second vertical structures in the one or more second openings.

In some embodiments, a second NAND memory device includes a substrate having a first layer stack on it. The first layer stack includes alternating conductor and insulator layers. A second layer stack is disposed over the first layer stack where the second layer stack also includes alternating conductor and insulator layers. One or more vertical structures extend through the first layer stack. A conductive material is disposed on a top surface of the one or more vertical structures. One or more second vertical structures extend through the second layer stack and abut a top surface of the conductive material.

In some embodiments, a method to form the second NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method includes removing a top portion of the conductive material to form one or more second recesses and forming depositing an insulating material in the one or more second recesses. The method also includes forming a second layer stack over the first layer stack, the second layer stack including alternating sacrificial and dielectric layers, and forming one or more second openings through the second layer stack and through a portion of the insulating material. The method includes removing the insulating material and forming one or more second vertical structures in the one or more second openings.

In some embodiments, a third NAND memory device includes a substrate having a first layer stack on it. The first layer stack includes alternating conductor and insulator layers. One or more vertical structures extend through the first layer stack. A conductive material is disposed on a top surface of the one or more vertical structures. An insulating layer is disposed over the first layer stack and over the conductive material. A second layer stack is disposed over the insulating layer where the second layer stack also includes alternating conductor and insulator layers. One or more second vertical structures extend through the second layer stack and through the insulating layer to abut a top surface of the conductive material.

In some embodiments, a method to form the third NAND memory device includes forming a first layer stack over a substrate, the first layer stack including alternating sacrificial and dielectric layers, and forming one or more first openings through the first layer stack. The method also includes forming one or more first vertical structures in the one or more first openings. The method includes removing a top portion of the one or more first vertical structures to form one or more first recesses, and depositing a conductive material within the one or more first recesses. The method includes depositing an insulating layer over the first layer stack and over the conductive material. The method also includes forming a second layer stack over the insulating layer, the second layer stack including alternating sacrificial and dielectric layers, and forming one or more second openings through the second layer stack and through the insulating layer. The method includes removing additional portions of the insulating layer at the bottom of the one or more second openings and forming one or more second vertical structures in the one or more second openings.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a first layer stack having first alternating conductor and insulator layers;
   a second layer stack, disposed over the first layer stack and having second alternating conductor and insulator layers;
   one or more first vertical structures extending through the first layer stack;
   one or more second vertical structures extending through the second layer stack;
   a conductive material sandwiched between the one or more first vertical structures and the one or more second vertical structures, wherein
     a first portion of the conductive material is inside the one or more first vertical structures; and
     a second portion of the conductive material is outside the one or more first vertical structures; and
   a top dielectric layer, sandwiched between the first layer stack and the second layer stack and surrounding the conductive material.

2. The memory device of claim 1, wherein the one or more first vertical structures comprise one or more first NAND strings and the one or more second vertical structures comprise one or more second NAND strings.

3. The memory device of claim 2, wherein each of the one or more first NAND strings and each of the one or more second NAND strings includes a plurality of memory layers surrounding a core insulating material.

4. The memory device of claim 3, wherein the plurality of memory layers includes a stack consisting of a blocking layer, a storage layer, a tunneling layer, and a channel layer.

5. The memory device of claim 4, wherein dopants originating from the conductive material are present in portions of the channel layer adjacent to the conductive material.

6. The memory device of claim 4, wherein the conductive material is disposed over a recess on a top portion of the one or more first NAND strings and is in contact with the blocking layer, the storage layer, the tunneling layer, and the channel layer of the one or more first NAND strings.

7. The memory device of claim 4, wherein the one or more second NAND strings further comprise a nested recess over the conductive material, the nested recess extending through the blocking layer, the storage layer and tunneling layer.

8. The memory device of claim 7, wherein the channel layer of the one or more second NAND strings is disposed over the nested recess, forming an ohmic contact with the conductive material.

9. The memory device of claim 4, wherein the one or more second vertical structures further comprise a top conductive material in a top portion, the top conductive material electrically connected to the channel layer of the one or more second vertical structures.

10. The memory device of claim 9, wherein the top conductive material comprises polysilicon.

11. The memory device of claim 9, wherein dopants originating from the top conductive material are present in portions of the channel layer adjacent to the top conductive material.

12. The memory device of claim 1, wherein a portion of the conductive material surrounds a lower end of the one or more second vertical structures.

13. The memory device of claim 1, wherein a width of the conductive material is greater than a width of the one or more first vertical structures and the one or more second vertical structures.

14. The memory device of claim 1, wherein the conductive material projects outward from the one or more first vertical structures and the one or more second vertical structures.

15. The memory device of claim 1, wherein the one or more second vertical structures extend through a portion of the conductive material.

16. The memory device of claim 1, wherein the conductive material is configured to provide electrical connection between the one or more first vertical structures and the one or more second vertical structures.

17. The memory device of claim 1, wherein the conductive material comprises polysilicon.

18. The memory device of claim 1, further comprising:
a first staircase structure formed in the first layer stack; and
a second staircase structure formed in the second layer stack.

19. The memory device of claim 18, wherein at least one of the one or more first vertical structures extend through the first staircase structure; and at least one of the one or more second vertical structures extend through the second staircase structure.

20. The memory device of claim 1, wherein the one or more first vertical structures and the one or more second vertical structures extend vertically into the top dielectric layer.

* * * * *